United States Patent [19]

Merriman

[11] 4,151,775

[45] May 1, 1979

[54] ELECTRICAL APPARATUS FOR DETERMINING THE PITCH OR FUNDAMENTAL FREQUENCY OF A MUSICAL NOTE

[76] Inventor: George W. Merriman, 90 Pierrepont St., Brooklyn, N.Y. 11201

[21] Appl. No.: 829,356

[22] Filed: Aug. 31, 1977

[51] Int. Cl.² .......................... G10H 1/00; G10H 3/00
[52] U.S. Cl. ...................................... 84/1.01; 84/1.16
[58] Field of Search ....................... 84/1.01, 1.16, 1.28

[56] References Cited

U.S. PATENT DOCUMENTS

| | | | |
|---|---|---|---|
| 3,539,701 | 11/1970 | Milde | 84/1.28 |
| 3,634,596 | 1/1972 | Rupert | 84/1.28 |
| 3,647,929 | 3/1972 | Milde, Jr. | 84/1.01 |

Primary Examiner—Stanley J. Witkowski
Attorney, Agent, or Firm—Kenyon & Kenyon, Reilly, Carr & Chapin

[57] ABSTRACT

An electrical apparatus for determining the fundamental frequency of a musical note wherein the apparatus comprises a plurality of means for generating and responding to pulse type signals. More particularly, first and second means responsive to an electrical representation of the musical note are provided for generating first and second pulse trains whose pulses corresponding to the maxima and minima, respectively, of the electrical representation. The aforesaid first pulse train is applied to a first input of a first logic circuit means whose second input is fed a further pulse train from the output of a second logic circuit means.

The second logic circuit means provides at its output either the second pulse train or a pulse train whose pulses are delayed relative to the pulses of the pulse train at the output of the first logic circuit means. In particular, during the initial stages of the electrical representation, the second logic circuit means is controlled to couple the former pulse train to its output and, thereafter, the latter pulse train.

With the logic circuit means so controlled and with the first logic circuit means designed to provide an output pulse only for successively occurring pulses at its first and second inputs, respectively, the output pulse train of the first logic circuit means will have a fundamental frequency which accurately portrays that of the electrical representation and, hence, the musical note represented thereby.

8 Claims, 4 Drawing Figures

Fig. 3.
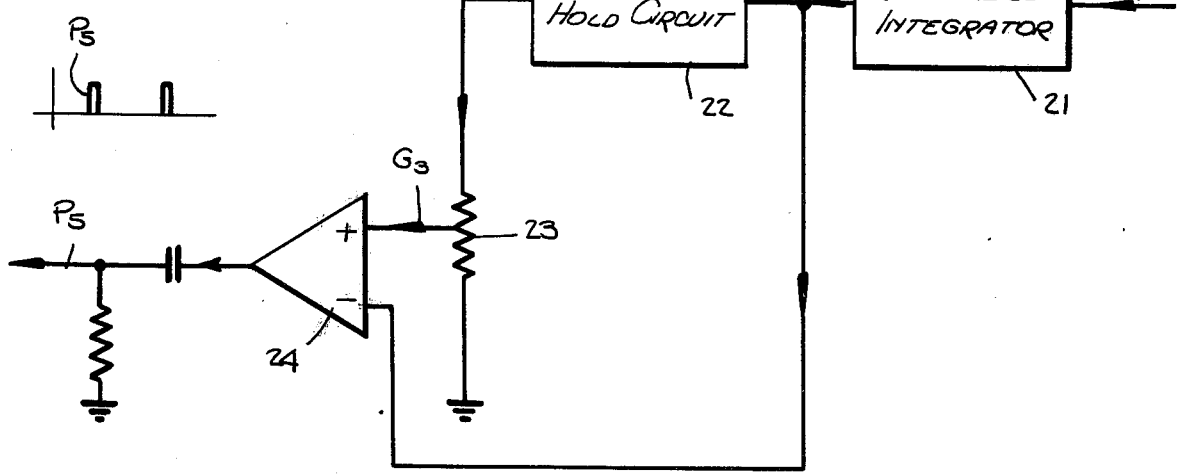
Fig. 4.
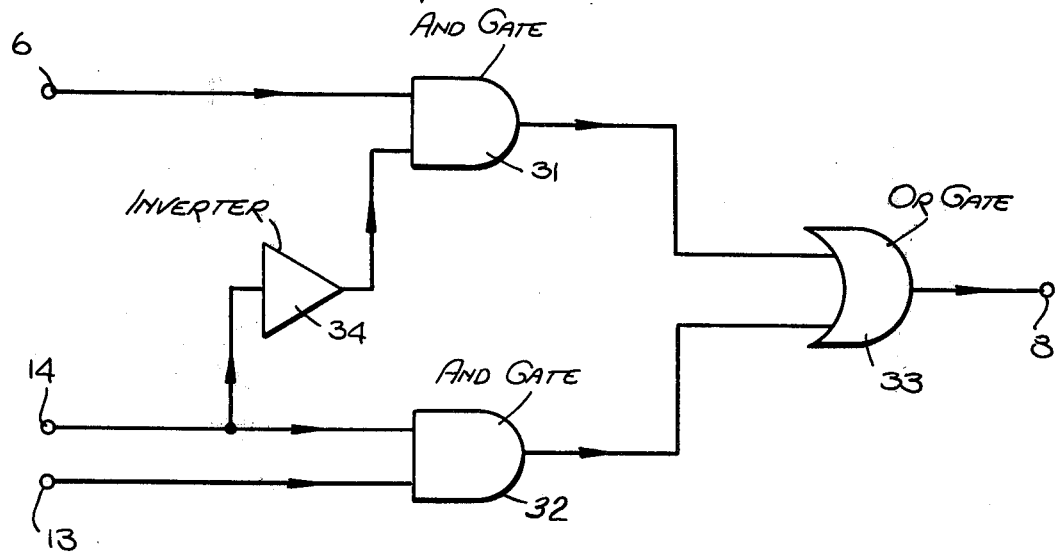

ELECTRICAL APPARATUS FOR DETERMINING THE PITCH OR FUNDAMENTAL FREQUENCY OF A MUSICAL NOTE

BACKGROUND OF THE INVENTION

1. Field of the Invention

This invention relates to an apparatus for use with musical instruments and, in particular, to an electrical apparatus for determining the pitch or fundamental frequency of a note emanating from a plucked or struck stringed musical instrument.

2. Description of the Prior Art

Prior art electrical devices for realizing a variety of sound effects in conjunction with musical instruments are known in the art. Operation of such devices in many cases is dependent upon first determining the pitch or fundamental frequency of a musical note being played. Apparatus for performing the latter function is also known in the art, but such apparatus has been either unreliable or expensive to construct.

One particular prior art apparatus for determining the pitch of a musical note is disclosed at pages 6b (3) and 6b (4) of the Musical Engineer's Handbook, published in 1975 by Electronotes. In the disclosed apparatus, an analog electrical signal representing the musical note, after amplification and filtering, is selectively fed, via a controlled analog switch, to a peak and downslope detector followed by a voltage controlled monostable multivibrator. The resultant output of the multivibrator is a train of electrical pulses whose period and, thus, fundamental frequency, are equal to those of the musical note.

For controlling the analog switch, the apparatus is further provided with a blanking circuit and a logic circuit. These two circuits act, in combination, to control the analog switch so that it feeds the entire analog signal to the peak and downslope detector for a set period of time after the inception of the signal. This, in turn, enables the multivibrator to establish an initial pulse train having an initial period and corresponding initial fundamental frequency. Thereafter, using the aforesaid pulse train, the blanking and logic circuits control the analog switch so that it now feeds to the detector only those portions of the analog signal which immediately surround the true maxima of the signal. In this manner, the apparatus, after establishing an initial fundamental frequency and period, is made substantially insensitive to any spurious peaks of the analog signal which might occur between the true maxima of such signal.

It is, therefore, a primary object of the present invention to provide an electrical apparatus for deriving the fundamental frequency of a musical note which gives improved performance and is less expensive to fabricate than prior art structures.

It is a further object of the present invention to provide an electrical apparatus of the aforesaid type which does not require the employment of analog switching techniques or analog switches.

SUMMARY OF THE INVENTION

The above and other objectives are realized in accordance with principles of the present invention in an electrical apparatus wherein the fundamental frequency of a musical note is drived through the use of circuitry operating on pulse train signals. More specifically, the apparatus of the present invention comprises a first means and a second means both of which are responsive to an electrical representation of the musical note. One of these means generates a first pulse train whose pulses correspond to the maxima of the electrical represenation, while the other means generates a second pulse train whose pulses correspond to the minima of the electrical representation. The aforesaid first and second pulse trains are applied, respectively, to a first input of a first logic circuit means and to a second logic circuit means for selective application to a second input of the first logic circuit means.

The first logic circuit means generates a pulse after the successive occurrence of pulses at its first and second inputs to thereby generate a third pulse train. This pulse train is fed to a third means which forms a pulse at a predetermined time after the occurrence of each particular pulse of the third train, the aforesaid predetermined time being a constant proportion of the time interval between the particular pulse and its preceding pulse. A fourth pulse train is, thus, generated by the third means and this pulse train is also applied to the second logic circuit means for selective application to the second input of the first logic means.

The selective application of the second and fourth pulse trains to the second input of the first logic means is controlled by the further application to the second logic circuit means of the signal from a fourth means, which is also responsive to the electrical representation of the musical note. The signal generated by the latter fourth means comprises a pulse which begins at the beginning of the electrical representation and lasts for a predetermined interval of time thereafter. The aforesaid signal, in turn, controls the second logic circuit means so that during the pulse of the signal the logic circuit means couples the second pulse train to the second input of the first logic circuit means. Thereafter, the signal controls the second logic circuit means such that it couples the fourth pulse train to said second input.

With the apparatus of the invention so formed, the generated third pulse train will have a period and, hence, fundamental frequency equal to the period and fundamental frequency of the electrical representation and, thus, the musical note represented thereby. Moreover, the generated period and fundamental frequency will be highly accurate portrayals of the period and fundamental frequency of the musical note, since operation of the components of the present apparatus depends primarily upon pulse signals and since switching between signals occurs via logic circuit means. Additionally, the size and cost of the apparatus is reduced due to the aforesaid use of logic circuit means.

In the embodiment of the invention to be disclosed hereinafter, the first and second means are in the form of maxima and minima signal detectors. The first and second logic circuit means, in turn, are formed as a flip-flop and a logic gate circuit, respectively. A resettable integrator, a differential amplifier and a sample and hold circuit form the third means, while, the fourth means includes an envelope detector followed by a monostable multivibrator.

BRIEF DESCRIPTION OF THE DRAWINGS

The above and other features and aspects of the present invention will become more apparent upon reading the following detailed description in conjunction with the accompanying drawings, in which:

FIG. 3 illustrates in more detail the reset pulse train generator of the apparatus of FIG. 1; and FIG. 4 illustrates in more detail the logic control circuit of the apparatus of FIG. 1.

DETAILED DESCRIPTION

Figure 1:
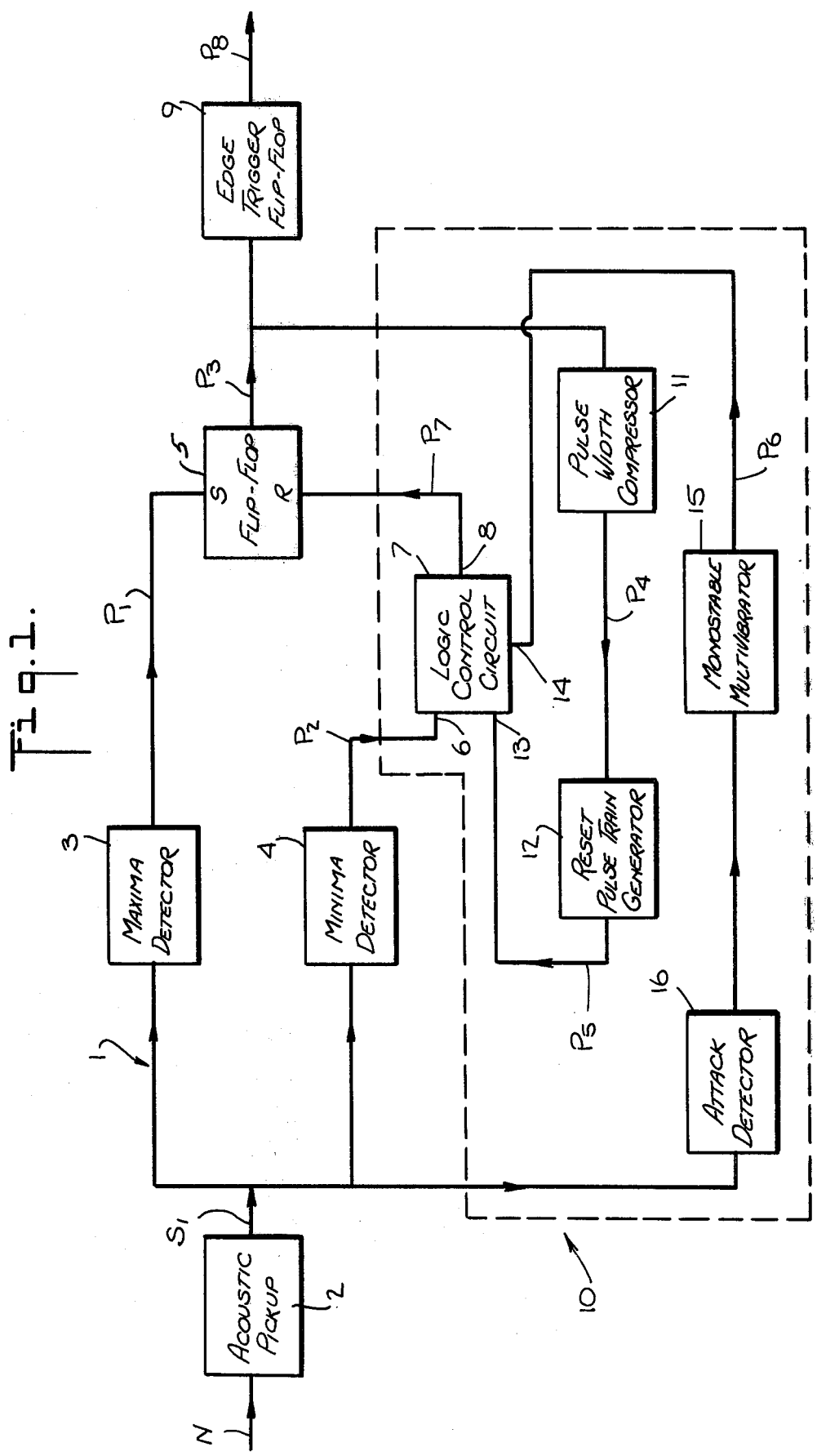
FIG. 1 shows an apparatus for deriving the fundamental frequency of an electrical representation of a musical note in accordance with the principles of the present invention.
Figure 2:
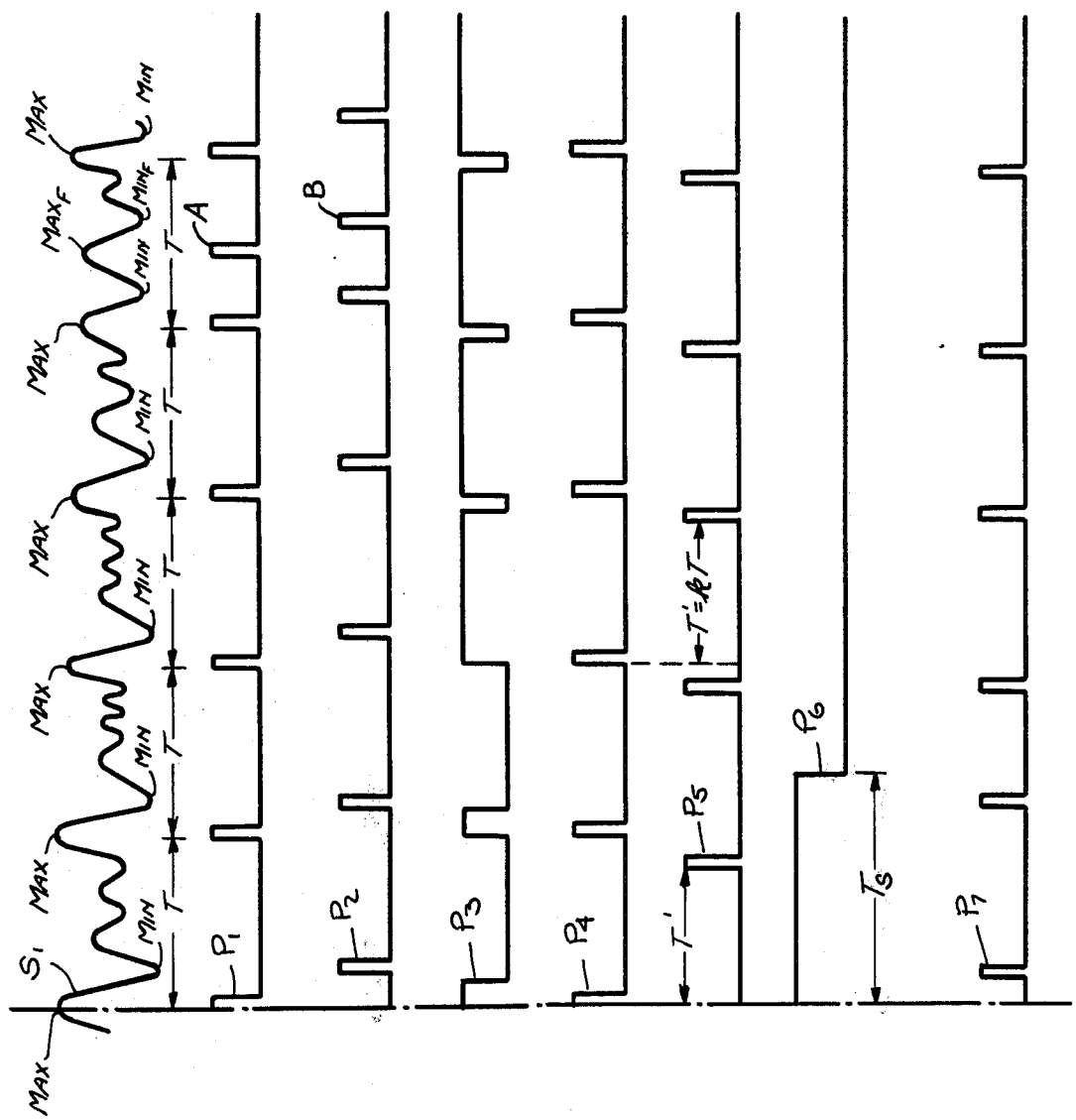
FIG. 2 shows waveform diagrams for various pulse signals of the apparatus of FIG. 1.

FIG. 1 illustrates an apparatus 1 for determining the fundamental frequency f of a musical note N in accordance with the principles of the present invention. The musical note may be generated by any type of plucked or struck instrument and is transformed by an acoustic pickup 2 into an electrical representation or signal $S_1$ whose waveform is shown in FIG. 2.

As can be seen, the signal $S_1$ is a substantially repetitive signal having a period T and fundamental frequency $F = 1/T$ which correspond to the period and fundamental frequency of its associated musical note No. At the beginning of each period, the signal undergoes a maximum excursion max and an immediately following minimum excursion min. Due to the decaying nature of the signal, the aforesaid maximum and minimum excursions become less pronounced in later occurring periods of the signal. The significance of this will be discussed hereinafter.

The signal $S_1$ is applied to maxima and minima detectors 3 and 4, respectively. Each of the latter detectors might typically be a circuit comprising a comparator whose inputs are connected across the diode which is connected in series with a parallel arrangement of a capacitor and resistor.

At each maximum of the signal $S_1$, the detector 3 generates an output pulse of short duration, while at each minimum of the signal $S_1$, the detector 4, likewise, generates an output pulse of short duration. The detectors 3 and 4, thus, form first and second pulses trains $P_1$ and $P_2$ whose pulses correspond to the maxima and minima, respectively, of the signal $S_1$.

As can be seen from the waveforms of pulse trains $P_1$ and $P_2$ shown in FIG. 2, due to the aforementioned decaying nature of the signal $S_1$, each of the detectors 3 and 4 generates a pulse during a period of the signal $S_1$, which for illustrative purposes is shown as the fifth period, which is not indicative of a true maximum or minimum of the signal. Thus, the train $P_1$ contains a pulse A corresponding to the false maximum $max_f$ of the signal $S_1$ and the train $P_2$ a pulse B corresponding to the false minimum $min_f$ of the signal. As will be explained more fully, hereinafter, the pulses A and B, if not inhibited, will result in erroneous determinations for the value of the period and fundamental frequency of the signal $S_1$ and hence, the musical note N represented thereby.

The pulse trains $P_1$ and $P_2$ are coupled, respectively, to the set input of a first logic means, which is in the form of a conventional set-reset flip-flop 5, and to a first input 6 of a second logic means, which is in the form of a logic control circuit 7. The latter circuit develops at its output 8 a further pulse train $P_7$ which is coupled to the reset input 8 of the flip-flop 5.

The flip-flop undergoes a change of state during a pulse appearing at its input S or R only if the immediately preceding pulse to the flip-flop was at its other input, i.e., at its input R or S, respectively. The flip-flop, thus, develops a pulse train output $P_3$ whose period is equal to T and, hence, whose fundamental frequency is equal to 1/T. The period and fundamental frequency of the pulse train $P_3$ hence correspond to those of the signal $S_1$ and, therefore, to those of the musical note N represented thereby.

In the present illustrative embodiment of the apparatus 1, the pulse train $P_3$ is applied to a third logic circuit means, which is in the form of a conventional edge trigger flip-flop 9 and which undergoes a change of state only during positive edge transitions of the pulse train $P_3$. The flip-flop 9 results in an output train $P_8$ which has twice the period and thus half the fundamental frequency of the train $P_3$ and, hence, the musical note N. The signal $P_8$ is typically used as an input to other processing equipment for developing various sound effects. Such equipment does not form part of the present invention and has not been specifically illustrated herein.

In accordance with the principles of the present invention in order to ensure that the fundamental frequency of the pulse train $P_3$ is, in fact, a true representation of the fundamental frequency of the signal $S_1$ and, hence, the note N, the apparatus 1 of the invention is provided with a further means 10 which comprises the logic control circuit 7 and other circuitry for substantially preventing the pulses A and B of the pulse trains $P_1$ and $P_2$, which pulses correspond to the false maximum $max_f$ and the false minimum $min_f$ of the signal $S_1$, from having an effect on the generation of the pulse train $P_3$. More particularly, in addition to the logic control circuit 7, the means 10 further includes a pulse width compressor 11, which typically might comprise a capacitor connected to one end of a resistor whose other end is grounded, which functions to shorten the widths but retain the period of the pulses of the train $P_3$. A short duration pulse train $P_4$ having a period or spacing between pulses exactly corresponding to that of the pulse train $P_3$ is, thus, generated by the compressor 11 and is coupled to a reset pulse train generator 12.

The reset pulse generator 12 generates a further short duration pulse train $P_5$ each of whose generated pulses occurs at a predetermined time T' after the occurrence of a corresponding pulse of the train $P_4$. The time T' is dependent upon the period or spacing between the aforesaid corresponding pulse of the train $P_4$ and its immediately preceding pulse and, in particular, is a constant proportion k of such period or spacing. The resultant pulse train $P_5$ from the generator 12 is applied to a second input 13 of the logic control circuit 7.

The latter control circuit functions to couple either the pulse train at its input 6 (i.e., the pulse train $P_2$) or the pulse train at its input 13 (i.e., the pulse train $P_5$) to its output 8 depending upon the state of a third pulse signal $P_6$ applied to its input 14. The pulse signal $P_6$ comprises the output of a monostable multivibrator 15 which is triggered at the beginning of the signal $S_1$ by an attack detector 16 of a type which might comprise a halfwave rectifier whose output is fed to high and a low pass filters whose outputs, in turn, are compared in a comparator.

The triggering of the multivibrator 15 places the multivibrator in its unstable state for a predetermined period of time $T_s$, after which the multivibrator returns to and remains in its stable state until triggered again. The signal $P_6$ thus comprises a pulse occurring at the beginning of the signal $S_1$ and lasting for the aforesaid predetermined period of time $T_s$.

The logic control circuit 7 is controlled by the pulse signal $P_6$ such that during the pulse of the signal $P_6$, the circuit couples the signal at its input 6 to its output 8 and during the remaining portion of the signal $P_6$, the circuit couples the signal at its input 13 to its output 8. Hence, beginning at the occurrence of the signal $S_1$ and for the predetermined period of time $T_s$ thereafter, the pulse train $P_2$ is coupled to the output 8 to form the pulse train $P_7$ for controlling the reset input R of the flip-flop 5. Thereafter, until the occurrence of a new signal $S_1$, the pulse train $P_5$ is coupled to the output 8 to form the train $P_7$ for controlling such reset input.

The operation of the circuit 10 to prevent the pulses A and B of the trains $P_1$ and $P_2$ from having an effect on the pulse train $P_3$ will now be explained by making reference to the waveforms of FIG. 2, all of which have already been alluded to above.

More particularly, at the start of the signal $S_1$, the detector 3 initiates generating of the pulse train $P_1$, which is coupled to the set input S of the flip-flop 5. Simultaneously therewith, the multivibrator 15 generates an output pulse which is coupled to the input 14 of the logic control circuit 7. This causes the pulse train $P_2$ being generated by the detector 4 to be coupled through the control circuit 7 to the reset input R of the flip-flop 5.

Since, as above indicated, the nature of the signal $S_1$ is such that during each of its periods a maximum excursion is always immediately followed by a minimum excursion, each pulse of the train $P_1$ developed by the detector 3 is always followed by a pulse of the train $P_2$ developed by the detector 4. Thus, application of the pulse trains $P_1$ and $P_2$ to the set and reset inputs of flip-flop 5 results in the flip-flow being reset by a pulse of the train $P_2$ after the occurrence of each pulse of the train $P_1$. As a result, each of the pulses of the train $P_1$ and its immediately following pulse of the train $P_2$ cause an output pulse to be generated by the flip-flop 5 and, thereby, the flip-flop 5 develops the pulse train $P_3$ whose period and fundamental frequency are equal to those of the train $P_1$ and, hence, the signal $S_1$. As long as the pulses of the trains $P_1$ and $P_2$ correspond to the true maxima and minima of the signal $S_1$ their period and fundamental frequency and, hence, the period of and fundamental frequency of the signal $P_3$ will correspond to those of the signal $S_1$.

However, as above indicated, as time goes on, the signal $S_1$ decays in amplitude so that the detectors 3 and 4 find it more difficult to discern the true maxima and minima of the signal. Thus, as also above indicated, after the fourth period of the signal $S_1$, the detectors 3 and 4 generate pulses A and B which result from detection of a false maximum max$_f$ and a false minimum min$_f$ of the signal $S_1$. If the circuit 10 were thus permitted to couple the pulse train $P_2$ to the reset input R of the flip-flop 5 for a period of time extending beyond the beginning of the fourth period of the signal $S_1$, a pulse of the train $P_3$ would be generated which would not be indicative of the true period and, hence, fundamental of the frequency signal $S_1$.

As above noted, however, the circuit 10 is controlled by the pulse signal $P_6$ to couple the train $P_2$ to the reset input R only during the time interval $T_s$ of the pulse of the signal. Thus, after such time interval, the control circuit 10 inhibits passage of the pulse train $P_2$ to the output 8 and, instead, now couples the pulse train $P_5$ to such output and, hence, to the reset input R.

As also above noted, the pulse train $P_5$ comprises pulses each of which is generated at a time T' after the occurrence of a corresponding pulse of the pulse train $P_4$, the time T' being a constant proportion k of the period or spacing between the aforesaid corresponding pulse and its preceding pulse. A value of said constant proportion k of 0.75 has been found to be particularly useful. Thus, by selecting the time interval $T_s$ of the pulse of the signal $P_6$ to be appropriately short relative to the time in which the signal $S_1$ undergoes significant enough decay to make its maxima and minima relatively difficult to detect, the aforesaid spacing between the pulses of the train $P_4$ up to the end of the time interval $T_s$ will correspond to the true period T of the signal $S_1$. A range which has been found to be particularly useful for $T_s$ is a range from 250 to 500 milliseconds. As a result, during the period of the signal $S_1$ immediately following the termination of the time interval $T_s$, the next pulse of the train $P_5$, which pulse is now coupled to and controls the reset input R of the flip-flop 5, will occur at a time kT after the beginning of the period, such beginning being the time of occurrence of its corresponding pulse of the train $P_4$. Any false pulses of the train $P_1$ which might occur prior the time kT from the beginning of the period will, hence, have no effect on the output pulse train $P_3$ of flip-flop 5, since the flip-flop will not have yet been reset by he pulse of the train $P_5$. Only after the occurrence of the pulse of the train $P_5$ at a time kT from the beginning of the period will the flip-flop 5 again be reset, thereby permitting it to respond to a further pulse of the pulse train $P_1$.

As can be appreciated, therefore, the first pulse of the train $P_5$ occurring during the period of the signal $S_1$ immediately following the termination of the time interval $T_s$ of the pulse of the signal $P_6$, occurs at a time kT after its corresponding pulse (the third pulse) of the train $P_4$ and, therefore, at a time kT after the third pulse of the trains $P_3$ and $P_1$. This pulse appears at the reset input of the flip-flop 5 and causes the flip-flop to reset itself and to respond to the next succeeding pulse (the fourth pulse) of the train $P_1$, this pulse being spaced at an interval T from its immediately preceding pulse. A corresponding fourth pulse of the train $P_3$ is thereby generated which leads to the generation of the fourth pulse of the train $P_4$ and to the fourth pulse of the train $P_5$.

The aforesaid fourth pulse of the train $P_5$ again appears at the reset input of the flip-flop 5 and permits the flip-flop 5 to respond to the fifth pulse of the train $P_1$, the latter pulse occurring at a time T from the fourth pulse. The response of the flip-flop leads to a fifth pulse of the train $P_3$ and a fifth pulse of the train $P_4$, the latter pulse, in turn, resulting in a fifth pulse of the train $P_5$ occurring at a time kT thereafter.

However, prior to the generation of the fifth pulse of the train $P_5$, the pulses A and B of the trains $P_1$ and $P_2$ occur due, as above noted, to the detection of the false maximum max$_f$ and the false minimum min$_f$ of the signal $S_1$. Since, at this time, the train $P_2$ is no longer being coupled to the output 8 of the circuit 7, the pulse B has no effect on the flip-flop 5 and, hence, the pulse train 3. Moreover, since as of the time of occurrence of the pulse A of the train $P_1$, the flip-flop 5 has not yet received a pulse at its reset input from the train $P_5$, the pulse A also has no effect on the flip-flop, and the flip-flop continues to generate the fifth pulse of the train $P_3$. Only after passage of the interval of time kT from the fifth pulse of the train $P_1$ does the fifth pulse of the train $P_5$ appear to again control the reset input R of the flip-flop 5. By this time the pulse A of the train $P_1$ has been dissipated and the next succeeding seventh pulse, which represents a true maximum of the signal $S_1$, is now able to generate a further sixth pulse for the signal $P_3$, the latter pulse now correctly indicating the beginning of the sixth period of the signal $S_1$.

The use of the pulse train $P_5$ to control the reset input of the flip-flop 5 after the predetermined time period or interval $T_s$ from the start of the signal $S_1$, thus, substantially eliminates the detected false maxima and minima of the signal $S_1$ from having an effect on the flip-flop output. Hence, the accuracy of the output of the flip-flop 5 as an indication of the period T and fundamental frequency f of the signal $S_1$ and, this, the note N is ensured.

As above-indicated, the time interval $T_s$ for the pulse of the pulse signal $P_6$ should be selected to be shorter than the time it takes for the signal $S_1$ to decay to a point at which its maxima and minima become relatively difficult to detect. Furthermore, it should be selected to be longer than the time it takes the reset pulse train generator 12 to stabilize in its generation of the pulse train $P_5$. The value selected for the interval $T_s$ will, thus, depend on the nature of the signal $S_1$ and the accuracy required of the apparatus. The value selected for the constant k used to generate the pulse train $P_5$ will likewise depend on the aforesaid parameters. Typically, values for the time interval $T_s$ in the range of approximately 250 to 500 milliseconds and of the factor k of approximately 0.75 have been found to provide satisfactory results for signals $S_1$, and, hence, notes N, having fundamental frequencies in the range of approximately 60 to 1200 Hz.

FIGS. 3 and 4 illustrate typical circuit configurations which can be employed for the reset pulse train generator 12 and the logic control circuit 7 of the apparatus of FIG. 1. More specifically, as shown in FIG. 3, the generator 12 comprises a conventional resettable integrator or ramp generator 21. The integrator 21 resets itself and performs an integration upon the receipt of each pulse of the pulse train $P_4$. the resultant integrated signal $G_1$ comprises a plurality of linear ramps, each having an amplitude which increases linearly with the passage of time between successively occurring pulses of the pulse train $P_4$ and, hence, the pulse train $P_3$.

The signal $G_1$ is applied to a conventional sample and hold circuit 22. The circuit 22 samples the signal at the peak of each ramp to develop a substantially constant level signal $G_2$, the latter constant level being proportional to the period between successive pulses of the trains $P_1$ and $P_4$. The signal $G_2$ is then coupled to a voltage divider in the form of a resistor 23 which generates a further signal $G_3$ which has an amplitude which is a proportion k of the amplitude the signal $G_2$. The signals $G_1$ and $G_3$ are then coupled to a comparator 24 which generates a pulse when the signal $G_1$ exceeds the signal $G_3$. The resultant pulse train formed at the output of the amplifier 24 is passed through an RC pulse width compressor, thereby resulting in the pulse train $P_5$.

The logic control circuit 7 of FIG. 4 comprises two AND Gates 31 and 32 whose outputs are coupled to an OR gate 33. The output of OR gate 33 forms the output 8 of the control circuit. The inputs 13 and 14 of the circuit, in turn, are formed by the two inputs of the AND gate 32. The other input of the circuit is formed by one input of the AND gate 31, the other input of which is coupled via an inverter 34 to the input 14. The operation of the circuit 7 of FIG. 3 to produce the pulse train $P_7$ at its input 8 in response to the pulse signals $P_2$, $P_5$ and $P_6$ at its inputs 6, 13 and 14, respectively, is straightforward and, hence, will not be further discussed herein.

In all cases, it is understood that the above-described arrangements are merely illustrative of the many possible specific embodiments which represent applications of the present invention. Numerous and varied other arrangements can readily be devised in accordance with the principles of the present invention without departing from the spirit and scope of the invention.

What is claimed is:

1. Electrical apparatus for determining the pitch of a musical note generated by plucking or striking a stringed musical instrument, said apparatus being adapted to be responsive to an electrical signal representing said musical note and comprising:
 a first means responsive to said electrical signal for generating a first pulse train whose pulses occur at the maxima of said electrical signal;
 a second means responsive to said electrical signal for generating a second pulse train whose pulses occur at the minima of said electrical signal;
 first logic circuit means responsive to said first pulse train and to another pulse train for generating a third pulse train each of whose pulses begins at the occurrence of a pulse of said first pulse train and terminates at the occurrence of the pulse of said other train immediately following that pulse of the first pulse train;
 third means responsive to said third pulse train for generating a fourth pulse train each of whose pulses occurs at a time T' after the occurrence of a pulse of said third pulse train, said time T' being a constant proportion k of the time period T between that pulse of said third pulse train and the immediately preceding pulse of said third pulse train;
 fourth means responsive to said electrical signal for generating a pulse signal including a pulse which begins at the beginning of said electrical signal and terminates at a predetermined time $T_s$ after said beginning of said electrical signal;
 and second logic circuit means responsive to said pulse signal of said fourth means for coupling said second pulse train to said first logic circuit means to provide said other pulse train during the occurrence of said pulse of said pulse signal and for coupling said fourth pulse train to said first logic circuit to provide said other pulse train after the termination of said pulse of said pulse signal.

2. Apparatus in accordance with claim 1 further comprising:
 a third logic circuit means responsive to said third pulse train for generating a fifth pulse train having a period which is twice that of said third pulse train.

3. Apparatus in accordance with claim 1 wherein:
 said constant proportion k is approximately 0.75.

4. Apparatus in accordance with claim 1 wherein:
 said predetermined time $T_s$ is within a range from 250 to 500 milliseconds.

5. Apparatus in accordance with claim 1 wherein:
 said second logic circuit means includes:
 a first AND gate, said first AND gate having a first input responsive to said pulse signal and a second input responsive to said fourth pulse train;

an inverter having an input responsive to said pulse signal;

a second AND gate having a first input responsive to said second pulse train and a second input responsive to the output of said inverter;

and an OR gate having first and second inputs responsive to the outputs of said first and second AND gates, respectively.

6. Apparatus in accordance with claim 5 wherein; said first logic circuit means comprises a set reset flip-flop having a set input responsive to said first pulse train and a reset input responsive to the output of said OR gate.

7. Apparatus in accordance with claim 1 wherein: said third means comprises:

resettable integrator means responsive to said third pulse train for performing a linear integration at the beginning of each of said pulses of said third pulse train;

generating means fo generating a signal during each integration of said integrator means whose amplitude is substantially constant and is k times the maximum amplitude of the output of said integrator means occurring during the previous integration;

and comparison means for comparing the output of said integrator means and said generating means and generating a pulse when said integrator output exceeds said generating means output.

8. Apparatus in accordance with claim 1 wherein: said generating means includes a sample-and-hold circuit;

and said comparison means includes a comparator.

* * * * *